(12) United States Patent
Stapelmann et al.

(10) Patent No.: US 8,501,632 B2
(45) Date of Patent: Aug. 6, 2013

(54) METHODS OF FABRICATING ISOLATION REGIONS OF SEMICONDUCTOR DEVICES AND STRUCTURES THEREOF

(75) Inventors: Chris Stapelmann, Poughkeepsie, NY (US); Armin Tilke, Beacon, NY (US)

(73) Assignee: Infineon Technologies AG, Neubiberg (DE)

( * ) Notice: Subject to any disclaimer, the term of this patent is extended or adjusted under 35 U.S.C. 154(b) by 1099 days.

(21) Appl. No.: 11/312,878

(22) Filed: Dec. 20, 2005

(65) Prior Publication Data

US 2007/0141852 A1   Jun. 21, 2007

(51) Int. Cl.
*H01L 21/31* (2006.01)
*H01L 21/469* (2006.01)

(52) U.S. Cl.
USPC .................................. 438/758; 257/E21.549

(58) Field of Classification Search
USPC ........................ 257/510, E21.549; 438/758
See application file for complete search history.

(56) References Cited

U.S. PATENT DOCUMENTS

| | | | |
|---|---|---|---|
| 5,387,538 A | 2/1995 | Moslehi | |
| 5,447,884 A | 9/1995 | Fahey et al. | |
| 5,492,858 A | 2/1996 | Bose et al. | |
| 5,691,232 A | 11/1997 | Bashir et al. | |
| 5,903,040 A | 5/1999 | Hong | |
| 5,989,978 A | 11/1999 | Peidous | |
| 6,037,237 A | 3/2000 | Park et al. | |
| 6,046,487 A * | 4/2000 | Benedict et al. | 257/510 |
| 6,127,241 A | 10/2000 | Rha | |
| 6,187,651 B1 | 2/2001 | Oh | |
| 6,218,693 B1 * | 4/2001 | Lu | 257/296 |
| 6,251,735 B1 | 6/2001 | Lou | |
| 6,251,748 B1 | 6/2001 | Tsai | |
| 6,277,706 B1 | 8/2001 | Ishikawa | |
| 6,309,924 B1 | 10/2001 | Divakaruni et al. | |

(Continued)

FOREIGN PATENT DOCUMENTS

| | | |
|---|---|---|
| EP | 0 690 493 A2 | 1/1996 |
| WO | WO 2005/027210 A1 | 3/2005 |

OTHER PUBLICATIONS

"5.6. Atomic Layer Deposition," Chapter 5, Sections 205.6-205.11, downloaded Nov. 16, 2005, 18 pp., http://depts.washington.edu/solgel/documents/class_docs/MSE502/Ch_5_Section_%205.6-2.11.pdf, University of Washington Materials Science and Engineering, Seattle, WA.

(Continued)

*Primary Examiner* — Robert J Hoffberg
*Assistant Examiner* — Igwe U Anya
(74) *Attorney, Agent, or Firm* — Slater & Matsil, L.L.P.

(57) ABSTRACT

Methods of fabricating isolation regions of semiconductor devices and structures thereof are disclosed. A preferred embodiment includes forming at least one trench in a workpiece, and forming a thin nitride liner over sidewalls and a bottom surface of the at least one trench and over a top surface of the workpiece using atomic layer deposition (ALD). An insulating material is deposited over the top surface of the workpiece, filling the at least one trench. At least a portion of the insulating material is removed from over the top surface of the workpiece. After removing the at least a portion of insulating material from over the top surface of the workpiece, the thin nitride liner in the at least one trench is at least coplanar with the top surface of the workpiece. The thin nitride liner and the insulating material form an isolation region of the semiconductor device.

17 Claims, 5 Drawing Sheets

U.S. PATENT DOCUMENTS

| | | | |
|---|---|---|---|
| 6,313,008 B1 | 11/2001 | Leung et al. | |
| 6,406,975 B1 | 6/2002 | Lim et al. | |
| 6,534,395 B2 | 3/2003 | Werkhoven et al. | |
| 6,589,853 B2 | 7/2003 | Kumamoto | |
| 6,593,207 B2 | 7/2003 | Hong et al. | |
| 6,620,703 B2 | 9/2003 | Kunikiyo | |
| 6,683,354 B2 | 1/2004 | Heo et al. | |
| 6,720,259 B2 | 4/2004 | Londergan et al. | |
| 6,740,592 B1 | 5/2004 | Doong | |
| 6,740,955 B1 | 5/2004 | Hong et al. | |
| 6,750,117 B1 | 6/2004 | Hung et al. | |
| 6,884,677 B2 | 4/2005 | Kim | |
| 7,118,987 B2 | 10/2006 | Fu et al. | |
| 7,163,860 B1* | 1/2007 | Kamal et al. | 438/257 |
| 7,229,896 B2 | 6/2007 | Chen et al. | |
| 7,327,009 B2* | 2/2008 | Chen et al. | 257/510 |
| 7,351,661 B2 | 4/2008 | Heo et al. | |
| 7,759,215 B2 | 7/2010 | Ohta | |
| 2001/0009809 A1 | 7/2001 | Miwa | |
| 2002/0004282 A1 | 1/2002 | Hong | |
| 2002/0031890 A1* | 3/2002 | Watanabe et al. | 438/296 |
| 2002/0072198 A1 | 6/2002 | Ahn | |
| 2002/0100953 A1* | 8/2002 | Park | 257/510 |
| 2002/0117731 A1 | 8/2002 | Kim et al. | |
| 2002/0127817 A1 | 9/2002 | Heo et al. | |
| 2002/0127818 A1 | 9/2002 | Lee et al. | |
| 2002/0197823 A1* | 12/2002 | Yoo et al. | 438/424 |
| 2004/0023516 A1* | 2/2004 | Londergan et al. | 438/785 |
| 2004/0029353 A1* | 2/2004 | Zheng et al. | 438/424 |
| 2004/0046426 A1* | 3/2004 | Deb et al. | 296/214 |
| 2004/0058507 A1 | 3/2004 | Ho et al. | |
| 2004/0082144 A1 | 4/2004 | Park et al. | |
| 2004/0106256 A1* | 6/2004 | Dong et al. | 438/257 |
| 2004/0115897 A1* | 6/2004 | Inoue et al. | 438/424 |
| 2004/0175919 A1* | 9/2004 | Ha et al. | 438/620 |
| 2004/0209479 A1 | 10/2004 | Heo et al. | |
| 2004/0214405 A1* | 10/2004 | Ahn et al. | 438/443 |
| 2004/0251513 A1* | 12/2004 | Su et al. | 257/510 |
| 2004/0266176 A1 | 12/2004 | Tanaka et al. | |
| 2005/0020091 A1 | 1/2005 | Fucsko et al. | |
| 2005/0079682 A1 | 4/2005 | Lee et al. | |
| 2005/0136618 A1* | 6/2005 | Lee et al. | 438/435 |
| 2005/0167778 A1 | 8/2005 | Kim et al. | |
| 2005/0170606 A1* | 8/2005 | Fu et al. | 438/424 |
| 2005/0277265 A1* | 12/2005 | Cha et al. | 438/435 |
| 2005/0287731 A1 | 12/2005 | Bian et al. | |
| 2005/0287759 A1* | 12/2005 | Wang et al. | 438/400 |
| 2006/0001104 A1* | 1/2006 | Ookura | 257/368 |
| 2006/0043521 A1* | 3/2006 | Trivedi et al. | 257/499 |
| 2006/0071274 A1* | 4/2006 | Cheng et al. | 257/347 |
| 2006/0089008 A1* | 4/2006 | Hong et al. | 438/778 |
| 2006/0105106 A1* | 5/2006 | Balseanu et al. | 427/248.1 |
| 2006/0105526 A1 | 5/2006 | Kwon et al. | |
| 2006/0125043 A1* | 6/2006 | Smythe et al. | 257/506 |
| 2006/0216950 A1* | 9/2006 | Matsuura | 438/775 |
| 2006/0220144 A1* | 10/2006 | Anezaki et al. | 257/374 |
| 2006/0246672 A1* | 11/2006 | Chen et al. | 438/301 |
| 2006/0270217 A1* | 11/2006 | Balseanu et al. | 438/653 |
| 2006/0286819 A1* | 12/2006 | Seutter et al. | 438/791 |
| 2007/0032039 A1* | 2/2007 | Chen et al. | 438/435 |
| 2007/0087565 A1* | 4/2007 | Culmsee et al. | 438/675 |
| 2007/0132054 A1* | 6/2007 | Arghavani et al. | 257/506 |
| 2007/0141852 A1 | 6/2007 | Stapelmann et al. | |
| 2007/0210305 A1 | 9/2007 | Kim et al. | |
| 2007/0232021 A1 | 10/2007 | Eun | |
| 2008/0138958 A1 | 6/2008 | Lee | |

OTHER PUBLICATIONS

Hausmann, D., et al., "Rapid Vapor Deposition of Highly Conformal Silica Nanolaminates," Science Magazine, Oct. 11, 2002, Abstract, http://www.sciencemag.org/cgi/content/abstract/298/5592/402, American Association for the Advancement of Science, Washington, DC.

Lucovsky, G., "Ultrathin Nitrided Gate Dielectrics: Plasma Processing, Chemical Characterization, Performance, and Reliability," IBM Journal of Research and Development, 1999, 24 pp., http://www.research.ibm.com/journal/rd/433/lucovsky.txt, IBM, Yorktown Heights, NY.

Cotler, T.J., et al., "*High Quality Plasma-Enhanced Chemical Vapor Deposited Silicon Nitride Films*", J. Electrochem. Soc., vol. 140, No. 7, Jul. 1993.

\* cited by examiner

_US 8,501,632 B2_

METHODS OF FABRICATING ISOLATION REGIONS OF SEMICONDUCTOR DEVICES AND STRUCTURES THEREOF

TECHNICAL FIELD

The present invention relates generally to the fabrication of semiconductor devices, and more particularly to the fabrication of isolation regions of semiconductor devices and structures thereof.

BACKGROUND

Semiconductor devices are used in a variety of electronic applications, such as computers, cellular phones, personal computing devices, and many other applications. Home, industrial, and automotive devices that in the past comprised only mechanical components now have electronic parts that require semiconductor devices, for example.

Semiconductor devices are manufactured by depositing many different types of material layers over a semiconductor substrate or wafer, and patterning the various material layers using lithography. The material layers typically comprise thin films of conductive, semiconductive, and insulating materials that are patterned and etched to form integrated circuits (IC's). There may be a plurality of transistors, memory devices, switches, conductive lines, diodes, capacitors, logic circuits, and other electronic components formed on a single die or chip.

Isolation regions are used to provide electrical isolation between active areas or electronic components formed on an integrated circuit. Shallow trench isolation (STI) and deep trench (DT) isolation are examples of some types of isolation regions that are widely used in semiconductor devices, although there are other types of isolation regions that may be formed.

STI regions are often used in complementary metal oxide semiconductor (CMOS) devices, which use both positive and negative channel devices in complementary configurations. The positive and negative channel devices of CMOS devices are typically referred to as p channel metal oxide semiconductor (PMOS) and n channel metal oxide semiconductor (NMOS) transistors. The PMOS transistor is formed in an n well (e.g., a well implanted with n type dopants) and the NMOS transistor is formed in a p well. An STI region is formed between the n well and p well of the PMOS transistor and the NMOS transistor, respectively. The STI region usually extends within a semiconductor substrate by about the depth of the maximum n well and p well doping concentration, e.g., by about 0.2 to 1.0 μm, for example.

To form isolation regions, trenches are usually formed in a substrate, and the trenches are filled with insulating materials. Etch processes and chemical mechanical polishing (CMP) processes are used to remove excess insulating material from the top surface of the substrate.

A problem that often occurs in the formation of isolation regions is the formation of recesses or divots in the insulating material used to fill the trenches. The lack of insulating material in the recessed or divoted areas can result in inadequate electrical isolation between active areas and undesired topography being formed on the top surface of the substrate.

Thus, what are needed in the art are improved methods of forming isolation regions and structures thereof.

SUMMARY OF THE INVENTION

These and other problems are generally solved or circumvented, and technical advantages are generally achieved, by preferred embodiments of the present invention, which provide novel methods of forming isolation regions of semiconductor devices and structures thereof.

In accordance with a preferred embodiment of the present invention, a method of fabricating a semiconductor device includes providing a workpiece, the workpiece having a top surface, and forming at least one trench in the workpiece, the at least one trench comprising sidewalls and a bottom surface. A thin nitride liner is formed over the sidewalls and the bottom surface of the at least one trench and over the top surface of the workpiece using atomic layer deposition (ALD). An insulating material is deposited over the top surface of the workpiece, filling the at least one trench with the insulating material. At least a portion of the insulating material is removed from over the top surface of the workpiece. After removing the at least a portion of insulating material from over the top surface of the workpiece, the thin nitride liner in the at least one trench is at least coplanar with the top surface of the workpiece. The thin nitride liner and the insulating material form an isolation region of the semiconductor device.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely in the formation of shallow trench isolation (STI) regions of semiconductor devices. The invention may also be applied, however, to the formation of other types of isolation structures, such as deep trench (DT) isolation, as an example.

Figure 1:
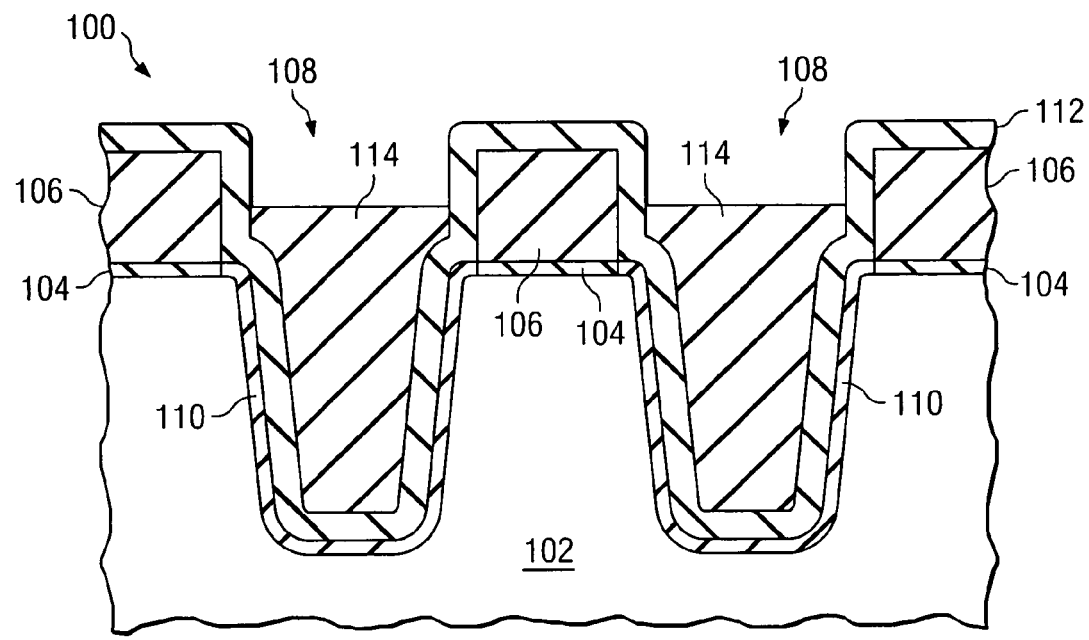
FIGS. 1 through 4 show cross-sectional views of a prior art method of forming isolation regions of a semiconductor device at various stages of manufacturing, wherein divots are formed over a nitride liner within the trench of the isolation regions.

With reference now to FIGS. 1 through 4, there is shown a prior art method of forming isolation regions of a semiconductor device 100 in a cross-sectional view at various stages of manufacturing. Referring first to FIG. 1, trenches 108 are formed in a substrate 102 having a pad oxide 104 and a pad nitride 106 formed thereon. An oxide liner 110 is formed over the sidewalls of the substrate 102, and a nitride liner 112 is formed using low pressure chemical vapor deposition (LPCVD) over the oxide liner 110 and over the pad oxide 104 and pad nitride 106, as shown. The trenches 108 are then filled with an insulating material 114 comprising silicon dioxide.

Figure 2:
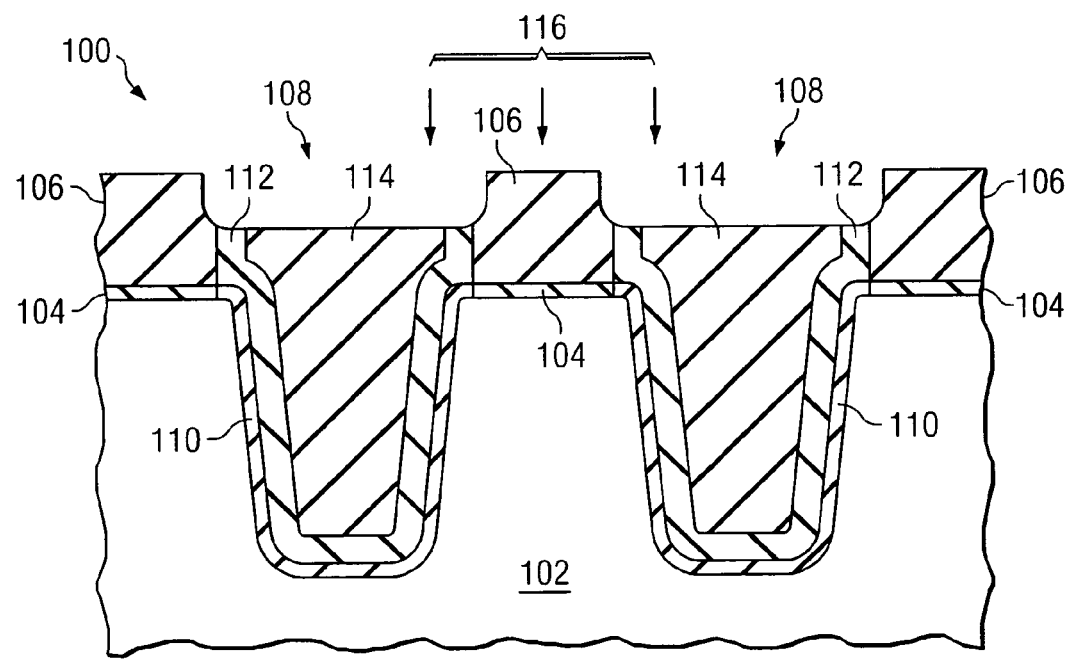

A phosphoric acid process 116 is used to remove the pad nitride 106 from over the substrate 102, as shown in FIG. 2. A CMP process may be used to facilitate the pad nitride removal, and the removal of excess insulating material 114 from above the top surface of the substrate 102, as shown in FIG. 3.

A problem with prior art isolation region formation is that the nitride liner 112 is relatively thick. For example, prior art nitride liners 112 typically are deposited by LPCVD, as described in U.S. Pat. No. 6,277,706 issued on Aug. 21, 2001 to Ishikawa, which is incorporated herein by reference, and in U.S. Pat. No. 5,447,884, issued on Sep. 5, 1995 to Fahey, et al., which is also incorporated herein by reference. For example, Ishikawa describes a nitride liner formed by LPCVD and having a thickness of 50 to 100 Angstroms. Fahey et al. describe a nitride liner formed by LPCVD and having a thickness of less than 5 nm (50 Angstroms); in particular, having a thickness of 4 nm.

Figure 3:
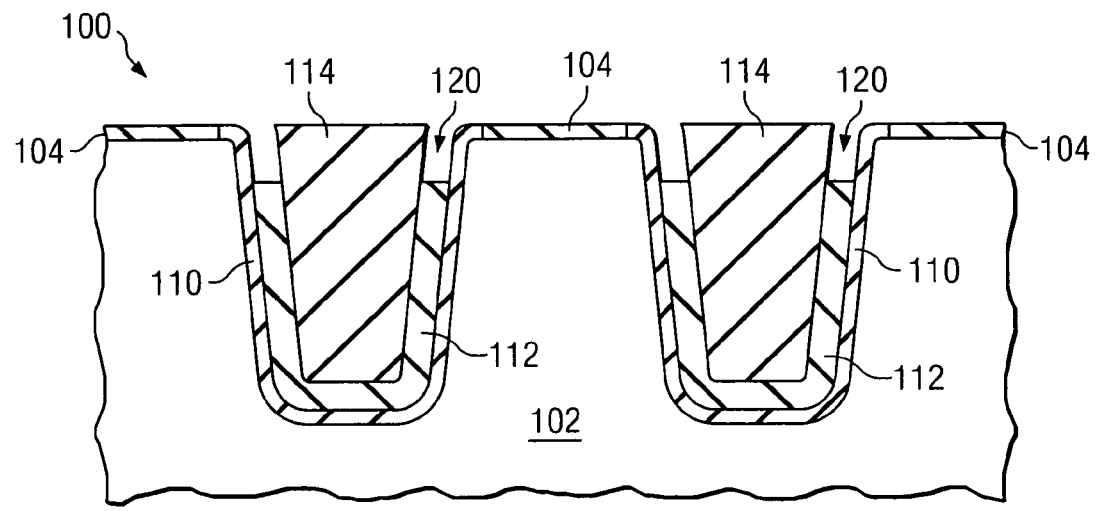

Because using LPCVD to form a nitride liner results in a relatively thick nitride liner 112, divots 120 form during the removal of the pad nitride 106 and during the removal of the excess insulating material 114 from above the top surface of the substrate 102, as shown in FIG. 3. Furthermore, using LPCVD to form nitride liners thinner than about 3 to 4 nm tends to result in incomplete and non-continuous liner formation, resulting in a poor diffusion barrier being formed. For example, Fahey et al. observed that a nitride liner formed by LPCVD and having a thickness of 3 nm (30 Angstroms) permitted oxidation of the substrate behind the nitride liner.

The divots 120 have a depth that is a function of the length of the pad nitride strip process and also partially a function of the thickness of the nitride liner 112, e.g., and may also be a function of the viscosity of the phosphoric acid used to remove excess insulating material 114 from above the top surface of the substrate 102. For example, the divots 120 may have a depth that is equal to or greater than the thickness of the nitride liner 112. If the nitride liner 112 is 100 Angstroms thick, the divots 120 may comprise a depth below a surface of the substrate 102 of about 100 Angstroms, for example. The divots 120 may form due to the similar etch rates of the pad nitride 106 and the nitride liner 112, as an example.

Figure 4:
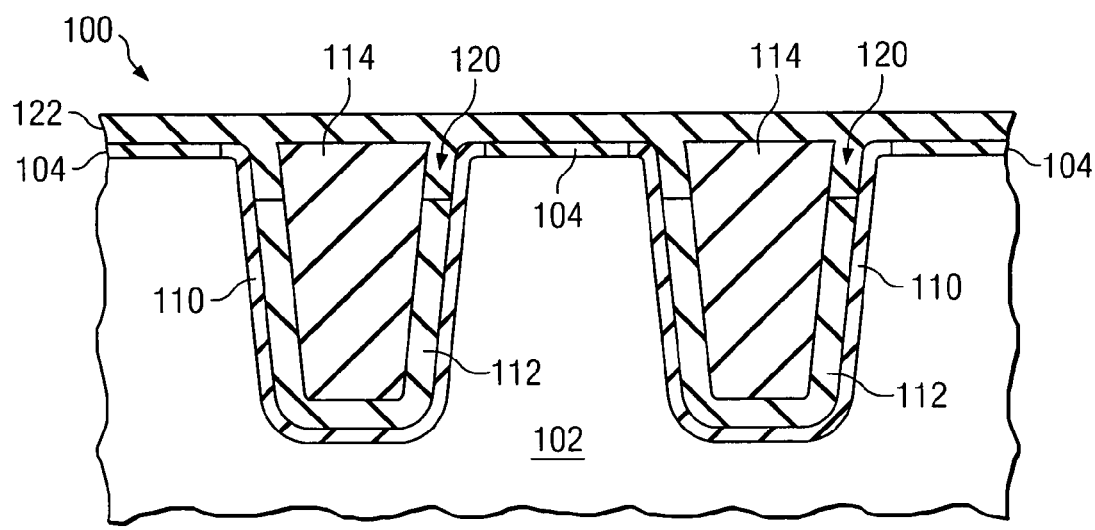

Divot 120 formation is problematic in that it results in poor electrical isolation of active areas within the substrate 102. Divot 120 formation also results in uneven and non-planar topography in the top surface of the substrate 102. The divots 120 increase the stress of the substrate 102, can cause shorts, and can cause degradation of the device at the corners near the divots 120. Thus, additional processing steps are required to refill the nitride liner over the divots 120, as shown in FIG. 4.

For example, an additional nitride liner 122 may be deposited or back-filled to fill the divots 120, and then another polishing and/or removal process is used to remove the nitride liner 122, and in some applications, also the pad oxide 104 from over the top surface of the substrate 102. Problems that may occur with this approach towards divot 120 repair include poor adhesion of back-filled nitride liner 122: the back-filled nitride liner 122 may detach and break off, which has similar deleterious effects as the divots 120 described above.

Embodiments of the present invention achieve technical advantages by using an ALD process to form a nitride liner for isolation region formation, resulting in an ultra thin nitride liner with continuous coverage, e.g., having no pores or regions lacking nitride formation. The formation of a thinner, continuous film may be achieved using ALD rather than LPCVD to form the nitride liner. The thin nitride liner results in no formation of divots due to the viscosity of the etchant chemistry, which may comprise phosphoric acid, as an example, proximate the extremely thin nitride liner during removal processes for a pad nitride layer and/or excess oxide fill material, to be described further herein.

FIGS. 5 through 9 show cross-sectional views of a method of forming isolation regions of a semiconductor device 250 at various stages of manufacturing, wherein ALD is used to form an ultra thin nitride liner. The novel ALD-formed thin nitride liner prevents the formation of divots over the thin nitride liner in subsequent manufacturing steps.

Figure 5:
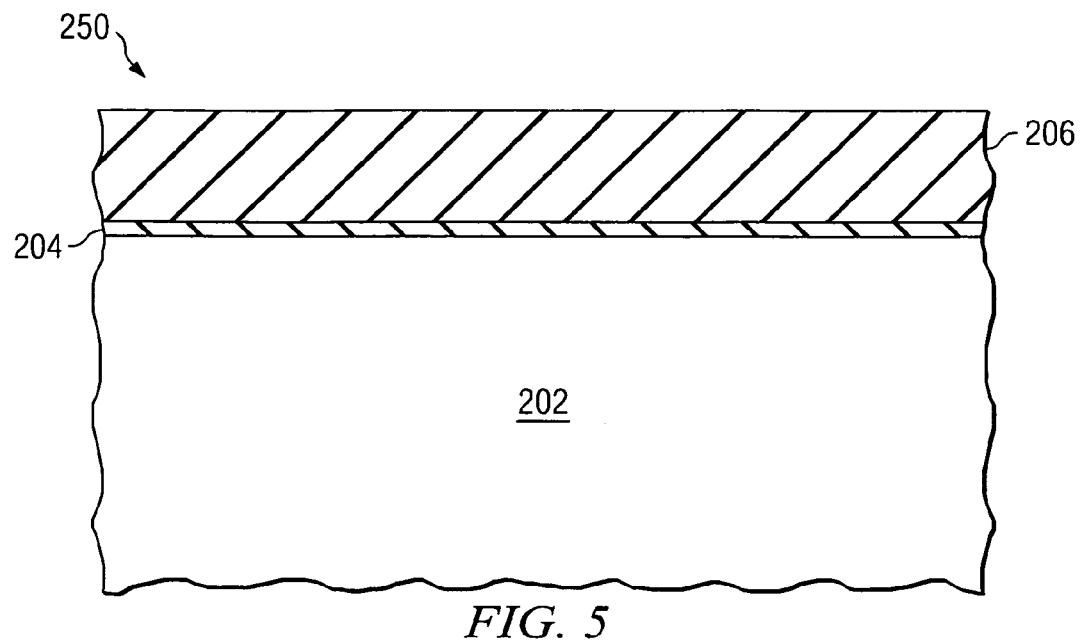
FIGS. 5 through 9 show cross-sectional views of a method of forming isolation regions of a semiconductor device at various stages of manufacturing, wherein ALD is used to form an ultra thin nitride liner within isolation trenches, which prevents the formation of divots over the thin nitride liner in subsequent manufacturing steps.

Referring next to FIG. 5, first, a workpiece 202 is provided. The workpiece 202 may include a semiconductor substrate comprising silicon or other semiconductor materials covered by an insulating layer, for example. The workpiece 202 may also include other active components or circuits, not shown. The workpiece 202 may comprise silicon oxide over single-crystal silicon, for example. The workpiece 202 may include other conductive layers or other semiconductor elements, e.g., transistors, diodes, capacitors, etc., not shown. Compound semiconductors, GaAs, InP, Si/Ge, or SiC, as examples, may be used in place of silicon. The workpiece 202 may also comprise bulk Si, SiGe, Ge, SiC, or a silicon-on-insulator (SOI) substrate, as examples.

A pad oxide 204 is formed over the workpiece 202. The pad oxide 204 may comprise about 4 nm of silicon dioxide ($SiO_2$), for example, although the pad oxide 204 may alternatively comprise other materials and dimensions. The pad oxide 204 is also referred to herein as a pad oxide layer, for example.

A pad nitride 206 is formed over the pad oxide 204. The pad nitride 206 may comprise about 100 nm of silicon nitride ($Si_xN_y$), for example, although the pad nitride 206 may alternatively comprise other materials and dimensions. The pad nitride 206 is also referred to herein as a pad nitride layer, for example. The pad nitride 206 and the pad oxide 204 are also referred to collectively herein as a sacrificial material 206/204, for example.

Figure 6:
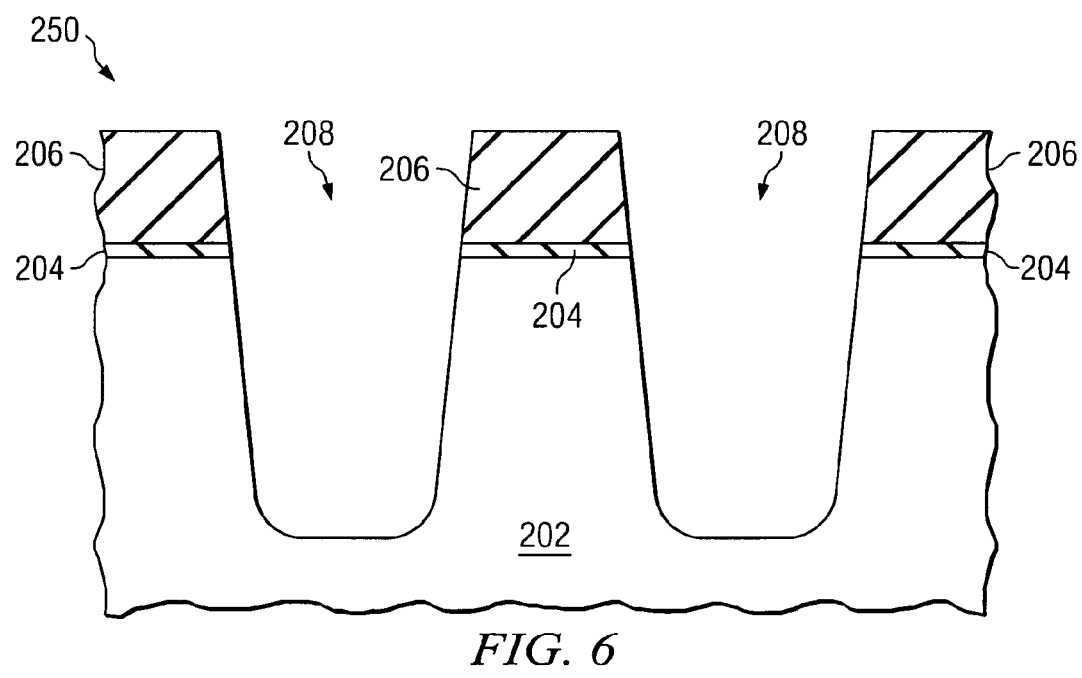

Trenches 208 for isolation regions are formed in the pad nitride 206, the pad oxide 204, and the workpiece 202, as shown in FIG. 6. The trenches 208 may comprise a depth from the top surface of the workpiece 202 of about 350 nm in some applications, although the depth may also comprise about 0.2 to 1.0 μm or greater, for example. The trenches 108 may comprise a width of about 20 nm to several μm, for example, although the trench width may comprise other dimensions.

Figure 7:
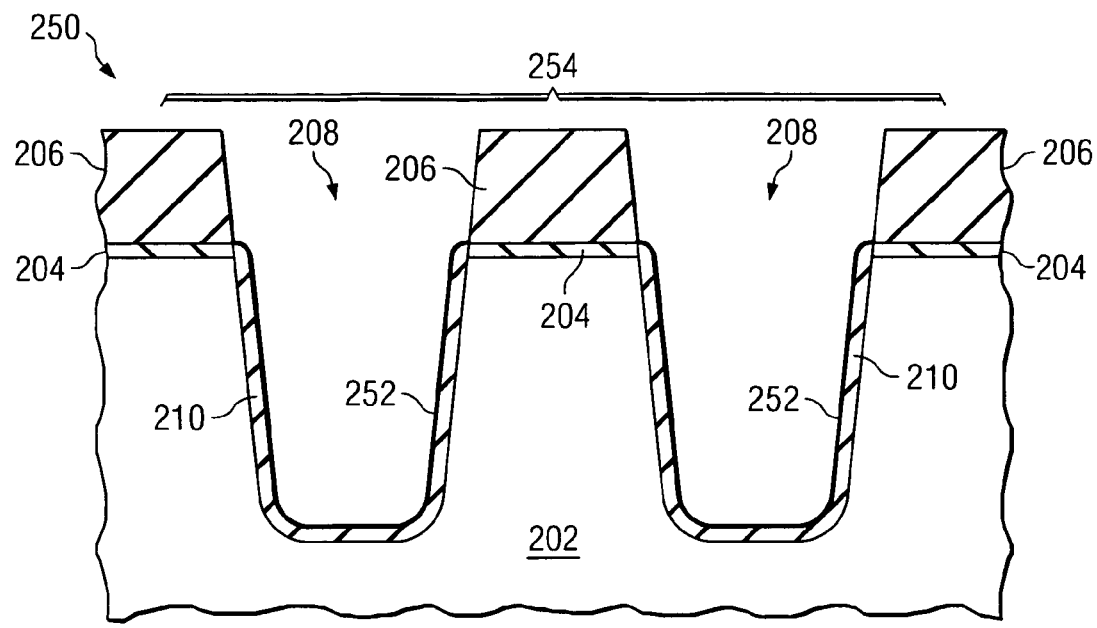

Next, sidewalls and bottom surfaces of the trenches 208 are oxidized to form an oxide liner 210, as shown in FIG. 7, e.g., using a thermal oxidation process in the presence of $O_2$, although other methods of oxidation may alternatively be used. The oxide liner 210 may comprise a thickness of about 5 to 10 nm, for example, although alternatively, the oxide liner 210 may comprise other dimensions. The oxide liner 210 preferably comprises a thickness of about 100 Angstroms or less, in some embodiments. The oxide liner 210 preferably comprises silicon dioxide, although alternatively, other oxides and insulating materials may also be used.

Preferably, the oxide liner 210 is formed only on the sidewalls of a portion of the trench 208 formed in the workpiece 202, as shown. Alternatively, the oxide liner 210 may also form on the sidewalls of the pad oxide 204, also shown in FIG. 7, and also on the pad nitride 206 within the trench 208 and over the top surface of the pad nitride 206 (not shown).

An atomic layer deposition (ALD) process 254 is preferably used to form an ultra thin nitride liner 252 on the sidewalls and bottom surface of the trenches 208, e.g., over the oxide liner 210 within the trenches 208, and also over the sidewalls of the pad oxide 204, pad nitride 206, and over the top surface of the pad nitride 206, as shown in FIG. 7. The ultra thin nitride liner 252 preferably comprises silicon nitride; e.g., the nitride liner 252 preferably comprises $Si_3N_4$, $Si_xN_y$, or $Si_3N_4$ or $Si_xN_y$ combined with a small amount of hydrogen, e.g., about 1% or less of hydrogen, in a preferred embodiment, although the nitride liner 252 may alternatively comprise other nitride materials, for example.

The ALD process 254 may comprise a rapid ALD (RAD) process, in one embodiment, for example. In another embodiment, the ALD process 254 may comprise a temperature of about 100 to 500 degrees C., in an ambient gas of $H_2$, $N_2$, Ar, He, using a gas or non-gas precursor, although other temperatures and ambient gases may also be used.

In one embodiment, the ALD process 254 preferably comprises a two cycle process. For example, a first cycle may be used that comprises a Si-forming cycle, and a second cycle may be used that comprises an N-forming cycle. The first cycle may comprise a first precursor comprising $SiH_4$, dichlorosilane (DCS), trichlorosilane (TCS), or other silicon-containing substances for the Si-forming cycle, and the second cycle may comprise a second precursor comprising $NH_3$, $N_2H_4$, or other nitrogen-containing substances for the N-forming cycle, as examples. Alternatively, the ALD process 254 may comprise a single cycle, or may comprise three or more cycles, as examples.

The ALD process 254 preferably comprises a pressure of about 1 to 100 Torr, and more preferably comprises a pressure of about 1 to 15 Torr, although alternatively, other pressures may be used. The ALD process 254 may comprise one or more deposition cycles, for example. Alternatively, other processing parameters may also be used. The ALD process 254 may comprise a self-limiting growth process with one atomic layer growth per cycle, for example. A precursor that is self-terminating or self-starving may be used in this embodiment, for example, and a number of cycles may be repeated to achieve the desired total thickness of the thin nitride liner 252. If a rapid ALD process 254 is used, a precursor may be used that is not self-limiting, for example. The deposition of a conformal film of about 30 or more atomic layers may be achieved in a single cycle if a rapid ALD process 254 is used, for example.

Advantageously, the nitride liner 252 is extremely thin, comprising a thickness of about 25 Angstroms or less in a preferred embodiment. More preferably, for example, the nitride liner 252 comprises a thickness of about 3 to 25 Angstroms or less, in another embodiment. Using an ALD process 254 to form the nitride liner 252 results in the formation of a continuous layer of nitride material (e.g., providing complete coverage) that may be deposited at these dimensions, for example. In other embodiments, the nitride liner 252 preferably comprises a thickness of at least 8 Angstroms, for example. For example, if the nitride liner 252 comprises a thickness of about 8 Angstroms or greater, the nitride liner 252 provides an effective barrier layer for the prevention of boron (B) penetration, which is an advantage if the workpiece 202 is implanted with B as a dopant material. The nitride liner 252 comprising a thickness of about 8 Angstroms or greater functions as an excellent diffusion barrier to other dopant species, as well. In this embodiment, the nitride liner 252 preferably prevents dopant materials such as B from the workpiece 202 from diffusing into the subsequently deposited insulating material 214, to be described further herein.

Because an ALD or RAD process 254 is used to form the nitride liner 252, the nitride liner 252 is very thin, yet comprises even, continuous coverage of the nitride liner 252 over sidewalls of at least the oxide liner 210, for example. In some embodiments, preferably the thin nitride liner 252 comprises a materials content that is not graded, e.g., the thin nitride liner 252 preferably comprises the same amount of Si and N throughout the entire thickness of the liner 252, e.g. from a point within the thin nitride liner 252 closest to the trench 208 sidewalls and bottom surface and moving inwardly towards the insulating material 214 filling the trench (see FIG. 8).

The nitride liner 252 preferably comprises the same material as the pad nitride 206, in one embodiment. The nitride liner 252 preferably comprises silicon nitride in some embodiments, although other nitride materials or insulating materials or diffusion barriers may also be used for the nitride liner 252, for example. The nitride liner 252 may comprise a single atomic layer, e.g., a monolayer, of silicon nitride molecules, in one embodiment. The nitride liner 252 may alternatively comprise a few monolayers, e.g., about 2 to 10 monolayers of silicon nitride molecules or more, in another embodiment. The nitride liner 252 preferably comprises a thickness that is about one tenth or less than the thickness of the oxide liner 210 on the sidewalls and bottom surface of the trenches 208, in another embodiment.

In an optional process, after the formation of the thin nitride liner 252 using ALD, the nitride liner 252 may be treated to improve the film composition and properties, such as improving the barrier properties and stress properties. For example, the workpiece 202 may be exposed to a treatment, such as an ultraviolet (UV) process, a plasma process, and/or heat process to treat the nitride liner 252. The UV process may comprise exposing the workpiece 202 to light having an ultraviolet wavelength, for example. The UV process is preferably performed at a temperature of about 250 to 800 degrees C. in one embodiment, and more preferably is performed at a temperature of about 400 to 550 degrees C., as examples, although other temperatures may also be used. The UV process may comprise a pressure of about 1 to 50 Torr in an ambient of Ar, $N_2$, or He, as examples, although alternatively, other pressures and ambient gases may also be used. The UV process may comprise a single wavelength or a broad band light source, as examples. In one embodiment, the UV process preferably comprises a broad band range that is optimized to maximize the UV treatment effect, for example.

The optional treatment may comprise a plasma process, in another embodiment. The plasma process may comprise exposing the workpiece 202 to plasma at a temperature of about 400 to 550 degrees C. The plasma process may comprise a pressure of about 1 to 100 Torr, and more preferably comprises a pressure of about 4 to 8 Torr in one embodiment. The plasma process may be performed in a nitrogen ambient, although alternatively, He, Ar, or other ambient gases may be used. The plasma process may be performed at high frequency radio frequency (HFRF) power of about 20 to 100 Watts, as examples. These processing parameters are listed as examples; alternatively, other processing parameters may also be used for the plasma process.

The optional treatment may comprise a heat process, in another embodiment. The heat process may comprise heating the workpiece 202 in a nitrogen ambient anneal process to a temperature of about 400 to 1,000 degrees C. for about 30 minutes to 3 hours, as examples, although alternatively, other temperatures, time periods and ambient gases may be used. The heat process preferably is performed in an ambient other than oxygen, in a preferred embodiment. One advantage of embodiments of the present invention is that an oxidizing anneal process is not required after the formation of the nitride liner 252, for example.

Alternatively, one or more of these treatment processes may be used, and/or other treatment processes may be used, for example. The optional treatment process may comprise one or more UV processes, plasma processes, and/or heat processes, as examples.

Advantageously, the optional treatment may be used to modulate the stress of the nitride liner 252. The nitride liner 252 may comprise silicon nitride comprising silicon and nitride with a small amount of hydrogen, due to incomplete dissociation of the SiN bonds during the deposition process. For example, the nitride liner 252 may be formed using a two-cycle process comprising silane and ammonia, which both contain hydrogen. The hydrogen may be present in a small amount in the thin nitride liner 252. The treatment, e.g., comprising a UV process, plasma process, and/or heat process, changes the hydrogen content of the nitride liner 252 and the treatment parameters may be selected to alter, e.g., decrease or increase, the tensile or compressive stress of the nitride liner 252. The optional treatment changes the bonding of the atoms of the liner 252, for example, and may improve device performance.

As an example, in one embodiment, a UV treatment process may be used to remove at least a portion of the hydrogen in the nitride liner 252, creating voids in the liner 252 material. The voids cause the liner 252 to shrink, and the removal of the hydrogen converts the voids to silicon-nitride bonds, resulting in increased tensile stress of the liner 252, e.g., by about 10 to 300% or greater. The nitride liner 252 after the ALD process 254 may comprise $Si_3N_4$ or $Si_xN_y$ combined with about 1% or less of hydrogen, and after the optional treatment process, the nitride liner 252 may comprise $Si_3N_4$ or $Si_xN_y$ combined with less than about 1% hydrogen, e.g., the nitride liner 252 contains a reduced amount of hydrogen compared to the nitride liner 252 hydrogen content after the ALD process 254.

Figure 8:
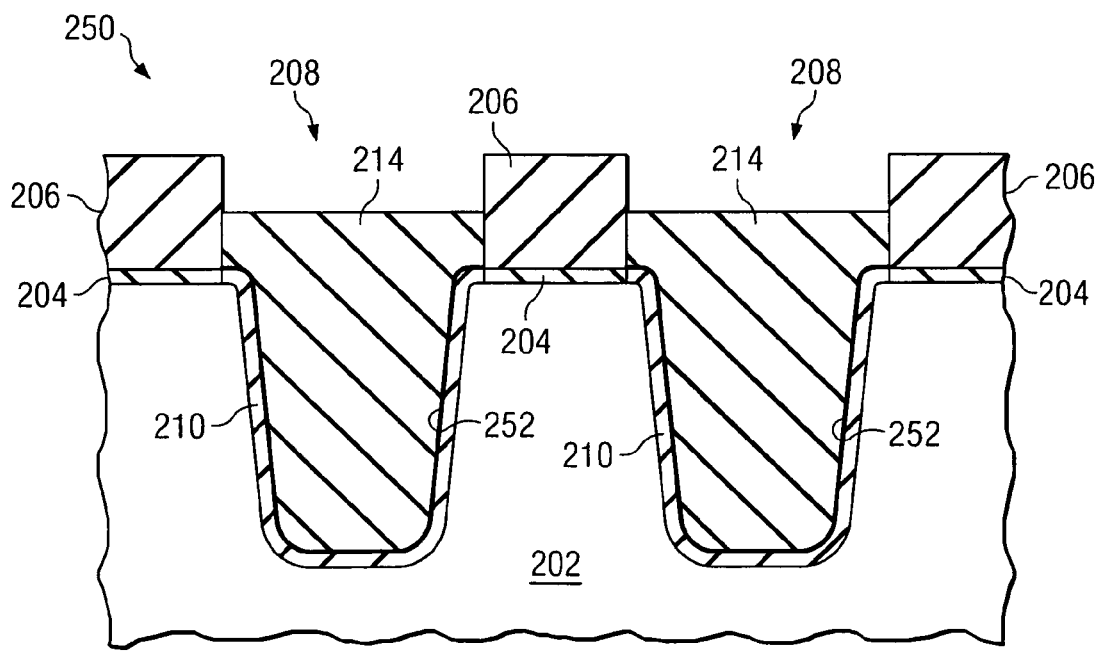

Next, an insulating material 214 is deposited or formed over the trenches 208, e.g., over the nitride liner 252, to fill the trenches 208 to a height at least above the top surface of the workpiece 202, as shown in FIG. 8. In some embodiments, the insulating material 214 may also be formed to a height above the bottom surface of the pad nitride 206, as shown, for example. The insulating material 214 preferably comprises an oxide material such as silicon dioxide, although alternatively, other insulating materials may be used for the insulating material 214.

Figure 9:
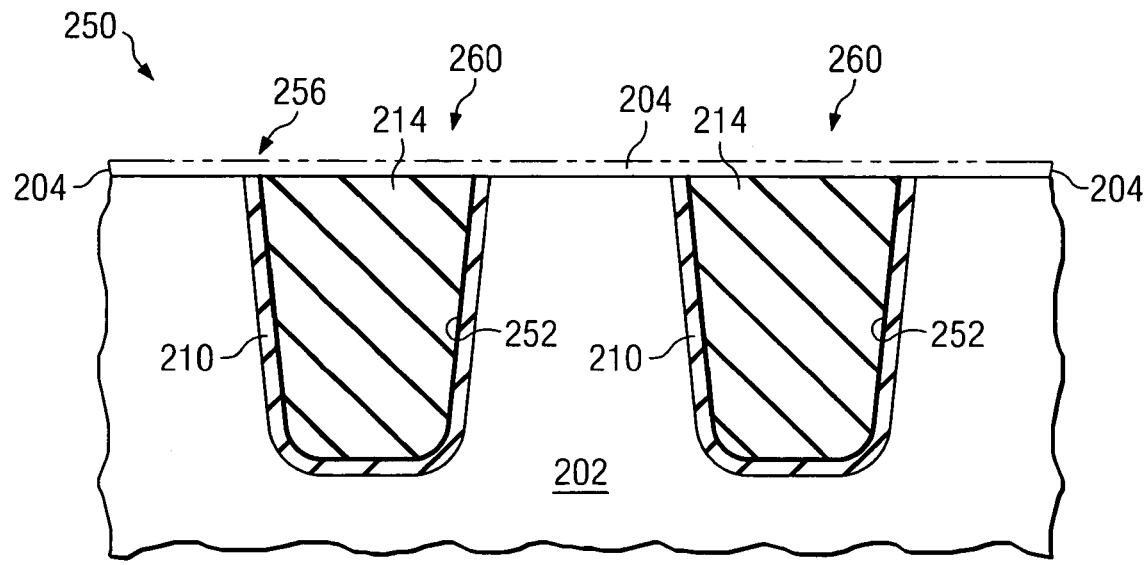

Next, one or more removal processes are used to remove the pad nitride 206 from the top surface of the workpiece 202 and to remove at least a portion of the excess insulating material 214 from above at least a portion of the top surface of the workpiece 202, leaving the structure shown in FIG. 9. For example, a first etch process comprising phosphoric acid may be used to remove the pad nitride 206. Optionally, a second etch process comprising hydrofluoric acid may then be used to remove at least a portion of the excess insulating material 214 from over at least a portion of the top surface of the workpiece 202. Alternatively, the excess insulating material 214 may be removed during the first etch process comprising phosphoric acid, for example. Different chemistries may also be used to remove oxide material and nitride material, for example. A chemical mechanical polishing (CMP) process may also be used to remove the excess insulating material 214 and/or the pad nitride 206, for example.

In the etch processes to remove the pad nitride 206 and excess insulating material 214, or in a separate etch process, the pad oxide 204 may also be removed, although alternatively, the pad oxide 204 may be left remaining in the structure, as shown in phantom in FIG. 9. If the pad oxide 204 is left remaining in the structure, then the insulating material 214, the oxide liner 210, and the nitride liner 252 are preferably at least coplanar with the top surface of the workpiece 202; e.g., the insulating material 214, the oxide liner 210, and the nitride liner 252 may extend slightly above the top surface of the workpiece 202 by about the thickness of the pad oxide 204, as shown in phantom.

In another embodiment, the pad oxide 204 is removed using an etch process that is preferably selective to silicon nitride. In this embodiment, the pad oxide 204 and a top portion of the insulating material 214 and the oxide liner 210 having a thickness about equal to the thickness of the pad oxide 204 are also removed from above a top surface of the workpiece 202. The thin nitride liner 252 may not be removed during this etch process to remove the pad oxide 204, for example. Thus, the thin nitride liner 252 may be at least coplanar with the top surface of the workpiece 202 in this embodiment; e.g., the thin nitride liner 252 may extend slightly above the top surface of the workpiece 202 by an amount equal to about the thickness of the pad oxide 204.

In yet another embodiment, the pad oxide 204 is removed using a CMP process, which also removes a top portion of the thin nitride liner 252. In this embodiment, the thin nitride liner 252 has a top surface that is coplanar with the top surface of the workpiece 202, for example.

Figure 10:
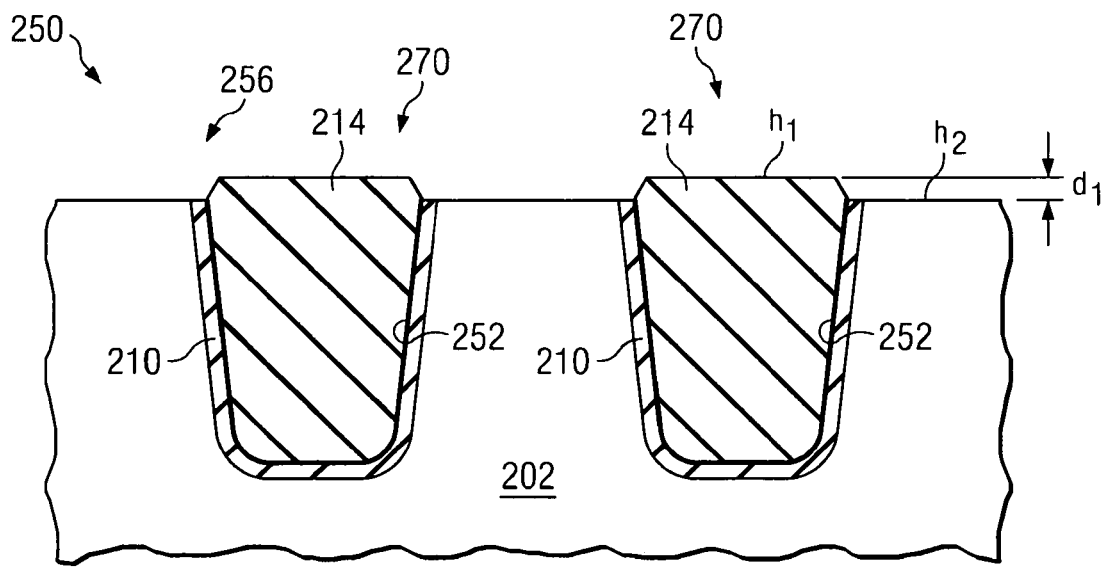
FIG. 10 shows a cross-sectional view of another preferred embodiment of the present invention, wherein isolation regions have a positive step height above the top surface of the workpiece.

Referring next to FIG. 10, in some embodiments, preferably the excess removal processes to remove the pad nitride 206 and at least a portion of the insulating material 214 over the trench 208 are designed to result in a positive step height $d_1$ above the workpiece 202, wherein the top surface $h_1$ of the insulating material 214 is greater than the top surface $h_2$ of the workpiece 202 by an amount $d_1$. The amount of the positive step height $d_1$ preferably comprises about 30 nm, and more preferably, about 0 to 40 nm, above the top surface $h_2$ of the workpiece 202 above the trench area, for example, although alternatively, the positive step height $d_1$ may comprise other dimensions.

The dimension $d_1$ may vary across a surface of a workpiece 202, by about 0 to 40 nm or more, due to variations in the etch processes, which may comprise dry or wet etch processes, as examples, used to remove excess insulating materials 206, 214 and liners 204, 252 from the top surface of the workpiece 202, for example. In other embodiments, the dimension $d_1$ may be about the same for isolation structures 260 (shown in FIG. 9) and isolation structures 270 (shown in FIG. 10) across the surface of a workpiece 202 and may comprise about 0 to 40 nm, for example. Preferably, however, in accordance with preferred embodiments of the present invention, a negative step height is not produced, e.g., preferably the top surface $h_1$ of the insulating material 214 is not lower than the top surface $h_2$ of the workpiece 202, which would result in inadequate isolation of the isolation structures 260 and 270, in some applications. The goal of a positive step height $d_1$ is preferable in some embodiments, to ensure that a negative step height is not produced, for example.

The sidewalls of the portion of the insulating material 214 that extends above the top surface of the workpiece 202 may be tapered inwardly towards the insulating material 214, as shown in FIG. 10, due to the preceding recessing and etching steps, for example.

Preferably, in accordance with preferred embodiments of the present invention, in the final structure of the isolation structures 260 and 270, the thin nitride liner 252 in the trench 208 is at least coplanar with the top surface of the workpiece 202; e.g., the thin nitride liner 252 is coplanar with the top surface of the workpiece 202, or the thin nitride liner 252 extends slightly above the top surface of the workpiece 202, by about 0 to 40 nm. Also, preferably, in the final structure of the isolation structures 260 and 270, the insulating material 214 in the trench 208 is at least coplanar with the top surface of the workpiece 202; e.g., the insulating material 214 is coplanar with the top surface of the workpiece 202, or the insulating material 214 extends slightly above the top surface of the workpiece 202, by about 0 to 40 nm. In preferred embodiments, advantageously, the thin nitride liner 252 and the insulating material 214 are preferably not recessed below the top surface of the workpiece 202 after the novel manufacturing processes described herein.

The isolation structures 260 and 270 comprise isolation structures comprised of the insulating material 214, the thin nitride liner 252, and the oxide liner 210. The isolation structures 260 and 270 may comprise STI regions, DT isolation regions, or other types of isolation structures, as examples. Before or after the formation of the novel isolation structures 260 and 270 described herein, two or more active areas (not shown) may be formed in the workpiece 202, and a trench 208 may be formed between two of the active areas, for example. The isolation structures 260 and 270 provide electrical isolation between the active areas. The optional treatment processes described herein improve the performance of the active areas, for example. For example, the active areas may comprise transistors, and the treatment process may result in improved device performance of the transistors, such as decreased power consumption and/or increased speed of a change in the state of the transistors, e.g., when the transistors are transitioned from an "off" state to an "on" state.

Advantages of embodiments of the invention include providing novel methods of forming isolation regions 260 and 270 and structures thereof, wherein divots are not formed e.g., in region 256 shown in FIGS. 9 and 10, over the ultra thin nitride liner 252 during the various insulating material 214, 206, 204, and 252 removal processes. Isolation regions 260 and 270 having a smooth topography or a positive step height, or combinations thereof, across the surface of a semiconductor workpiece 202 are formed in accordance with embodiments of the present invention. For example, some isolation regions 260 may have a top surface of the insulating material 214 is coplanar with the top surface of the workpiece 202, as shown in FIG. 9, and other isolation regions 270 may have a positive step height, e.g., the top surface of the isolation regions 270 may extend above the top surface of the workpiece 202 by an amount $d_1$, as shown in FIG. 10.

No nitride liner refill processes (such as the one shown in prior art FIG. 4) are required by preferred embodiments of the present invention, advantageously reducing the number of manufacturing process steps required to manufacture the semiconductor device 250, and thus reducing costs. Because a nitride liner refill process is not required, the problems associated with nitride liner refill processes are avoided, such as the possibility of poor adhesion of the refilled liner and subsequent yield loss, and also reducing the possibility of contamination of the isolation regions 260 and 270.

The optional treatment processes described herein may alter the stress of the nitride liner 252, improving device performance. The thin nitride liner 252 provides an excellent diffusion barrier in some embodiments, preventing substances such as implanted dopant species (e.g., implanted into the workpiece 202) from diffusing into the insulating material 214 of the isolation regions 260 and 270, and thus preserving or improving the electrical isolation properties of the novel isolation regions 260 and 270, for example.

Experimental results show that the ultra thin nitride liner 252 described herein result in the formation of no divots proximate the nitride liner 252. Because the extremely thin nitride liner 252 is ultra thin, it was expected that divots would be formed that were less deep than divots that form with thicker nitride liners. However, advantageously, unexpected results were achieved by experimental results of embodiments of the present invention, in that no divots were formed at all. It is believed that no divots form proximate the thin nitride liner 252 due to the extreme thinness of the thin nitride liner 252, possibly combined with the viscosity of the etchant chemistry proximate the extremely thin nitride liner 252 during subsequent removal processes used to remove the pad nitride layer 204 and/or excess oxide fill 214 material, for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a semiconductor device, the method comprising:
   forming at least one trench in a semiconductor substrate having a top surface, the at least one trench comprising sidewalls and a bottom surface;
   forming an oxide liner on the sidewalls and the bottom surface of the at least one trench, wherein the oxide liner is formed directly on the semiconductor substrate;
   forming a nitride liner directly on the oxide liner and over the top surface of the semiconductor substrate using atomic layer deposition (ALD), the nitride liner having a thickness of about 3 Å to about 25 Å;

treating the nitride liner, wherein treating the nitride liner comprises treating the nitride liner with a plasma process, a heat process, a UV process, or combinations thereof, in order to alter a tensile or compressive stress; and completely filling the at least one trench in a single process with an insulating material directly on the nitride liner.

2. The method according to claim 1, further comprising removing a portion of the insulating material from over the top surface of the semiconductor substrate, wherein after removing the portion of insulating material from over the top surface of the semiconductor substrate, the oxide liner, the nitride liner and a remaining portion of the insulating material in the at least one trench are coplanar with the top surface of the semiconductor substrate, and wherein the oxide liner, the nitride liner and the remaining portion of the insulating material form an isolation region of the semiconductor device.

3. The method according to claim 1, wherein using atomic layer deposition (ALD) comprises performing a first Si-forming cycle and then performing an N-forming cycle.

4. A method of fabricating a semiconductor device, the method comprising:
  forming at least one trench in a semiconductor substrate having a top surface, the at least one trench comprising sidewalls and a bottom surface;
  forming an oxide liner on the sidewalls and the bottom surface of the at least one trench, wherein the oxide liner is formed directly on the semiconductor substrate;
  forming a nitride liner directly on the oxide liner and over the top surface of the semiconductor substrate using atomic layer deposition (ALD), wherein forming the nitride liner comprises forming $Si_3N_4$, $Si_xN_y$, or $Si_3N_4$ or $Si_xN_y$ combined with about 1% or less of hydrogen, and wherein the nitride liner comprises a thickness of about 3 Å to about 25 Å;
  treating the nitride liner, wherein treating the nitride liner comprises treating the nitride liner with a plasma process, a heat process, a UV process, or combinations thereof, in order to alter a tensile or compressive stress; and
  completely filling the at least one trench in a single process with an insulating material directly on the nitride liner.

5. The method according to claim 4, further comprising forming a sacrificial material layer over the semiconductor substrate before forming the at least one trench in the semiconductor substrate, wherein forming the at least one trench in the semiconductor substrate further comprises forming the at least one trench in the sacrificial material layer, wherein forming the nitride liner further comprises forming the nitride liner over sidewalls of the sacrificial material layer and over a top surface of the sacrificial material layer, and further comprising removing at least a portion of the sacrificial material layer, after filling the at least one trench with the insulating material.

6. The method according to claim 4, further comprising removing a portion of the insulating material from over the top surface of the semiconductor substrate, wherein after removing the portion of the insulating material from over the top surface of the semiconductor substrate, the oxide liner, the nitride liner, and a remaining portion of the insulating material in the at least one trench are coplanar with the top surface of the semiconductor substrate, and wherein the oxide liner, the nitride liner and the remaining portion of the insulating material form an isolation region of the semiconductor device.

7. The method according to claim 4, wherein using atomic layer deposition (ALD) comprises performing a first Si-forming cycle and then performing an N-forming cycle.

8. A method of forming an isolation region of a semiconductor device, the method comprising:
  forming a pad oxide over a top surface of a semiconductor substrate;
  forming a pad nitride over the pad oxide;
  forming at least one trench in the pad nitride, the pad oxide, and the semiconductor substrate;
  forming an oxide liner over at least a portion of the at least one trench formed in the semiconductor substrate, wherein the oxide liner is formed directly on the semiconductor substrate;
  forming a nitride liner over the at least one trench and directly on the oxide liner using atomic layer deposition (ALD), the nitride liner having a thickness of about 25 Angstroms or less;
  treating the nitride liner with a process to increase a tensile stress of the nitride liner, wherein the process comprises a plasma process, a heat process, a UV process, or combinations thereof, after forming the nitride liner;
  after treating the nitride liner, completely filling the at least one trench in a single process with an oxide material, wherein the oxide material is directly disposed on the nitride liner;
  removing a first portion of the oxide material, the pad oxide and the pad nitride; and
  wherein after removing the first portion of the oxide material, the pad oxide and the pad nitride, the oxide liner, the nitride liner, and a second portion of the oxide material are coplanar with the top surface of the semiconductor substrate, and wherein the nitride liner, the oxide liner, and the second portion of the oxide material form the isolation region of the semiconductor device.

9. The method according to claim 8, wherein forming the pad nitride and the nitride liner comprise forming silicon nitride, and wherein forming the pad oxide, the oxide liner, and the oxide material comprise forming silicon dioxide.

10. The method according to claim 8, further comprising forming at least two active areas in the semiconductor substrate, wherein forming the at least one trench comprises forming a trench between the at least two active areas, and wherein depositing the oxide material comprises forming a shallow trench isolation (STI) region between the at least two active areas.

11. The method according to claim 8, further comprising forming at least two active areas in the semiconductor substrate, wherein forming the at least one trench comprises forming a trench between the at least two active areas, wherein depositing the oxide material comprises forming a shallow trench isolation (STI) region between the at least two active areas, and wherein treating the nitride liner improves a performance of the active areas.

12. A method of forming an isolation region of a semiconductor device, the method comprising:
  forming a sacrificial material layer over a top surface of a semiconductor substrate;
  forming at least one trench in the sacrificial material layer and the semiconductor substrate, the at least one trench comprising sidewalls and a bottom surface;
  forming an oxide liner over at least the sidewalls and the bottom surface of the at least one trench in the semiconductor substrate, wherein the oxide liner is formed directly on the semiconductor substrate;
  forming an ultra thin nitride liner over at least the oxide liner using atomic layer deposition (ALD), the ultra thin nitride liner being continuous and having a thickness of about 25 Angstroms or less;

treating the ultra thin nitride liner with a treatment to increase a stress of the ultra thin nitride liner, wherein the treatment comprises a UV treatment between about 400-550° C.; and after treating the ultra thin nitride liner, depositing an oxide material directly on the ultra thin nitride liner to completely fill the at least one trench in a single process.

13. The method according to claim 12, wherein forming the ultra thin nitride liner comprises forming the ultra thin nitride liner using rapid ALD.

14. The method according to claim 12, wherein at least a portion of the sacrificial material layer comprises a pad nitride layer comprising silicon nitride, wherein forming the ultra thin nitride liner comprises forming silicon nitride, and wherein removing at least the portion of the sacrificial material from over the semiconductor substrate comprises removing the pad nitride layer.

15. The method according to claim 12, wherein at least a portion of the sacrificial material layer comprises a pad oxide layer comprising silicon dioxide, wherein forming the oxide liner comprises forming silicon dioxide, and wherein filling the at least one trench with the oxide material comprises filling the trench with silicon dioxide.

16. The method according to claim 12, further comprising removing at least a portion of the sacrificial material layer from over the semiconductor substrate; and removing the portion of the oxide material from over the top surface of the semiconductor substrate, wherein after removing the portion of the oxide material from over the top surface of the semiconductor substrate, the oxide liner, the ultra thin nitride liner and a remaining portion of the oxide material are coplanar with the top surface of the semiconductor substrate.

17. The method according to claim 12, wherein using atomic layer deposition (ALD) comprises performing a first Si-forming cycle and then performing an N-forming cycle.

* * * * *